(12) United States Patent
Hendriks

(10) Patent No.: US 11,647,594 B2
(45) Date of Patent: May 9, 2023

(54) METHOD FOR CURING SOLDER PASTE ON A THERMALLY FRAGILE SUBSTRATE

(71) Applicant: NCC NANO, LLC, Dallas, TX (US)

(72) Inventor: Rob Jacob Hendriks, Eindhoven (NL)

(73) Assignee: PulseForge, Inc., Austin, TX (US)

( * ) Notice: Subject to any disclaimer, the term of this patent is extended or adjusted under 35 U.S.C. 154(b) by 287 days.

(21) Appl. No.: 17/072,801

(22) Filed: Oct. 16, 2020

(65) Prior Publication Data
US 2021/0037661 A1 Feb. 4, 2021

Related U.S. Application Data

(63) Continuation of application No. 15/875,699, filed on Jan. 19, 2018, now Pat. No. 10,849,239.

(51) Int. Cl.
*H05K 3/34* (2006.01)
*B23K 1/005* (2006.01)
(Continued)

(52) U.S. Cl.
CPC ........... *H05K 3/3494* (2013.01); *B23K 1/005* (2013.01); *B23K 1/0016* (2013.01);
(Continued)

(58) Field of Classification Search
CPC .............. H05K 3/3494; H05K 3/3452; H05K 2201/2054; H05K 2203/107; H05K 3/10; H05K 3/12; H05K 3/1216; H05K 3/02; H05K 3/125; H05K 3/4664; H05K 3/4673; H05K 3/3478; H05K 3/3489;
(Continued)

(56) References Cited

U.S. PATENT DOCUMENTS 5,495,089 A * 2/1996 Freedman ............ H05K 3/3494
219/121.64
6,160,239 A * 12/2000 Cubero Pitel .... H05K 2203/107
228/49.5
(Continued)

FOREIGN PATENT DOCUMENTS

JP 2008068322 A * 3/2008 ........... B23K 1/0056

OTHER PUBLICATIONS

Illyefalvi-Vitez et al., "Laser Soldering for Lead-free Assembly," 2007 30th International Spring Seminar on Electronics Technology (ISSE), 2007, pp. 471-476. (Year: 2007).*

*Primary Examiner* — A. Dexter Tugbang
(74) *Attorney, Agent, or Firm* — Antony P. Ng; Russell Ng PLLC

(57) ABSTRACT

A method for curing solder paste on a thermally fragile substrate is disclosed. An optically reflective layer and an optically absorptive layer are printed on a thermally fragile substrate. Multiple conductive traces are selectively deposited on the optically reflective layer and on the optically absorptive layer. Solder paste is then applied on selective locations that are corresponding to locations of the optically absorptive layer. After a component has been placed on the solder paste, the substrate is irradiated from one side with uniform pulsed light. The optically absorptive layer absorbs the pulsed light and becomes heated, and the heat is subsequently transferred to the solder paste and the component via thermal conduction in order to heat and melt the solder paste.

8 Claims, 5 Drawing Sheets

(51) Int. Cl.
*H05K 3/00* (2006.01)
*H05K 3/10* (2006.01)
*B23K 1/00* (2006.01)
*H05K 3/12* (2006.01)
B23K 101/42 (2006.01)
B23K 103/00 (2006.01)
H05K 1/02 (2006.01)
H01L 23/00 (2006.01)
H05K 3/02 (2006.01)

(52) U.S. Cl.
CPC ............. *H05K 3/0082* (2013.01); *H05K 3/10* (2013.01); *H05K 3/12* (2013.01); *H05K 3/1216* (2013.01); *H05K 3/3452* (2013.01); *H05K 3/3478* (2013.01); *H05K 3/3489* (2013.01); *B23K 2101/42* (2018.08); *B23K 2103/40* (2018.08); *B23K 2103/42* (2018.08); *H01L 24/82* (2013.01); *H05K 1/0274* (2013.01); *H05K 3/02* (2013.01); *H05K 3/125* (2013.01); *H05K 2201/0112* (2013.01); *H05K 2201/2054* (2013.01); *H05K 2203/107* (2013.01)

(58) Field of Classification Search
CPC ......... H05K 3/0082; H05K 2201/0112; B23K 2101/42; B23K 2103/40; B23K 2103/42; B23K 1/005; H01L 24/82
See application file for complete search history.

(56) References Cited

U.S. PATENT DOCUMENTS

| | | | |
|---|---|---|---|
| 2003/0007332 A1* | 1/2003 | Seki | H05K 3/4644 361/750 |
| 2010/0021657 A1* | 1/2010 | Lochtman | H05K 2203/107 427/596 |
| 2012/0313886 A1* | 12/2012 | Hu | H05K 3/12 345/174 |
| 2015/0257278 A1* | 9/2015 | Niskala | H05K 3/1216 264/129 |

* cited by examiner

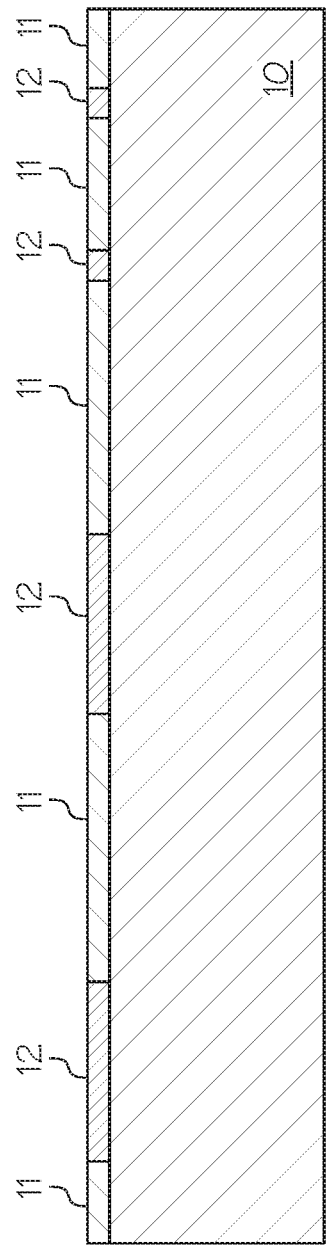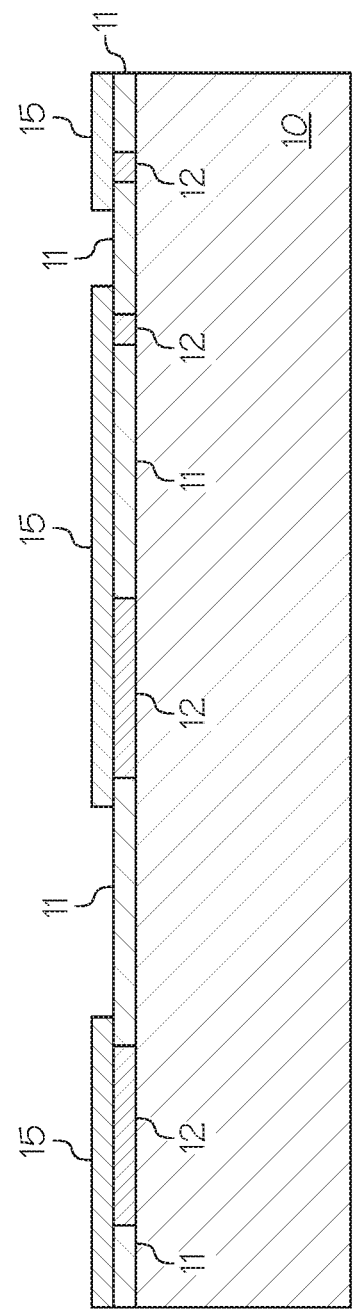

METHOD FOR CURING SOLDER PASTE ON A THERMALLY FRAGILE SUBSTRATE

RELATED APPLICATIONS

The present application is a continuation application of U.S. Ser. No. 15/875,699, filed on Jan. 19, 2018.

TECHNICAL FIELD

The present invention relates to curing processes in general, and, in particular, to a method for curing solder paste on a thermally fragile substrate using pulsed light.

BACKGROUND

In the field of printed electronics, the current trend is to move away from using ceramic, glass, or epoxy fiber glass-based circuit boards (such as FR4) as a substrate material, and progresses towards relatively inexpensive substrates for lower cost and more flexible form factors. The new substrate materials, such as polyethylene napthalate (PEN), polyethylene terephthalate (PET), polycarbonate and paper, however, tend to be more thermally fragile than their predecessors. This can become problematic when high temperatures are required to process thin films or to attach discrete components to the substrates. For example, the process of soldering components onto thermally fragile substrates becomes very difficult because conventional solders require a much higher processing temperature than those thermally fragile substrates can handle.

The present disclosure provides an improved method for curing solder paste on a thermally fragile substrate.

SUMMARY OF THE INVENTION

In accordance with a preferred embodiment, an optically reflective layer and an optically absorptive layer are printed on a thermally fragile substrate. Multiple conductive traces are selectively deposited on the optically reflective layer and on the optically absorptive layer. Solder paste is then applied on selective locations that are corresponding to locations of the optically absorptive layer. After a component has been placed on the solder paste, the substrate is irradiated from one side with uniform pulsed light. The optically absorptive layer absorbs the pulsed light and becomes heated, and the heat is subsequently transferred to the solder paste and the component via thermal conduction in order to heat and melt the solder paste.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIGS. 1A-1D depict a method for curing solder paste on a thermally fragile substrate using pulsed light, according to a first embodiment.

DETAILED DESCRIPTION OF A PREFERRED EMBODIMENT

Figure 1C:
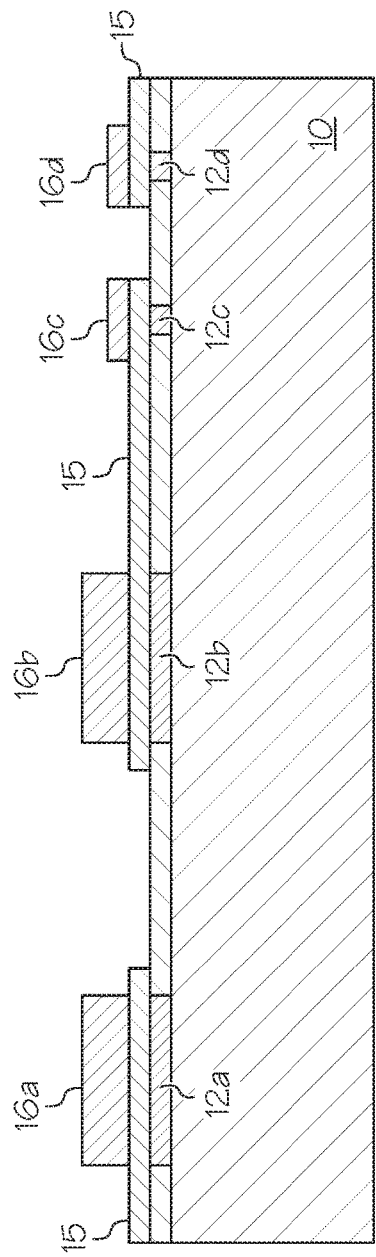

One major hurdle that needs to be overcome when using thermally fragile substrates as circuit boards is chip attachment. Generally, there are only two methods for attaching chips to a thermally fragile substrate. The first method is to use a low-temperature solder to attach components, and the second method is to use electrically conducting epoxy to attach the components. The problem with the first method is that the performance of low-temperature solders is significantly less robust than that of the higher temperature conventional solders, and thermal cycling may cause low-temperature solders to crack. The second method is more expensive than using conventional solder. In addition, the electrically conducting epoxy is mechanically more fragile, and the electrical resistivity of conductive adhesives used in the second method are much worse than that of low-temperature solder. Thus, neither of the above-mentioned two methods is preferable due to low performance and/or high cost.

Generally speaking, it is preferable to use standard Restriction of Hazardous Substances Directive (RoHS) compliant solder such as Sn 96.5/Ag 3.0/Cu 0.5 or Sn 96.5/Ag 3.5 alloys. These solders have a liquidus temperature of about 219° C. Typical oven reflow soldering temperature conditions are greater than 200° C. for 5 minutes. Unfortunately, the oven reflow soldering technique precludes the use of thermally fragile substrates such as PEN (having a maximum working temperature of 180° C.), PET (having a maximum working temperature of 150° C.), polycarbonate (having a maximum working temperature of 115-130° C.), or paper (having a maximum working temperature of 150° C.).

In the past, the photonic curing technique has been utilized to process a thin film on a thermally fragile substrate. Basically, the combination of higher temperature and lower thermal budget from a short pulse of light can be utilized to process the thin film without damaging the thermally fragile substrate. Now, the photonic curing technique has the potential of alleviating the problem of thermally processing solder paste on thermally fragile substrates. In theory, solders can be heated in a time scale so short that the thermally fragile substrate may also be heated beyond its maximum working temperature. In practice, however, this does not solve the above-mentioned problem because photonic curing generally applies to the processing of thin films on comparatively thick substrates. In the photonic curing technique, a thin film on a thermally fragile substrate is heated very rapidly by pulsed light from a flashlamp to a temperature beyond what the thermally fragile substrate can ordinarily take without being damaged. After heating by the pulsed light, the thin film is rapidly cooled via thermal conduction by the thin film to the thermally fragile substrate. This is possible because the thermally fragile substrate is much thicker than the thin film and has greater thermal mass than that of the thin film. The combination of the greater thermal mass of the thermally fragile substrate and thermal conduction of the heat from the thin film to the thermally fragile substrate helps to prevent incurring damage to the thermally fragile substrate by minimizing the time spent at elevated temperature, even though the peak temperature is often higher than the published maximum working temperature of the thermally fragile substrate.

However, with the case of component attachment, the components as well as the solder paste are often thicker than the thermally fragile substrate. Thus, the amount of energy required to solder the components with a pulse of light would also warp the thermally fragile substrate in the process. For example, the amount of radiant exposure needed to process the solder paste is between 3 and 30 J/cm². This amount of energy is often higher than the damage threshold of most electrical traces that may be deposited on the thermally fragile substrate as they absorb some of the pulsed light from the flashlamp. When this happens, the electrical traces can become hot and may ablate or locally warp the thermally fragile substrate underneath or adjacent to the electrical traces. Additionally, the rapid heating releases volatiles in the solder paste that can causes cohesive failure on the solder paste. In other words, gas generation from the rapid heating explodes the solder paste and destroys any hope of making a good solder connection.

Another problem with using pulsed light from a flashlamp to heat the solder paste is that components of different area and thickness require different radiant exposures. Since semiconductor components are thermally conductive, they need to be heated to the same temperature that the solder paste needs to be heated since their thermal conductivity is much greater than that of the substrate. This means that components of differing thicknesses or area require different amounts of radiant exposure as their thermal mass is different. When the different sized components are all located on the same substrate, it is not possible to cure all solder connections simultaneously without over curing some while under curing others.

In order to address the above-mentioned problems associated with the photonic curing technique, the present invention provides an improved method for soldering electrical components onto a thermally fragile substrate.

Referring now to the drawings, and in particular to FIGS. 1A-1D, there is illustrated a method for curing solder paste on a thermally fragile substrate using pulsed light, according to a first embodiment. Initially, an optically reflective layer 11 and an optically absorptive layer 12 are selectively printed on a thermally fragile substrate 10, as shown in FIG. 1A. The locations of optically absorptive layer 12 should correspond to the future locations of solder paste to be utilized to connect to a component. Thermally fragile substrate 10, which is preferably optically transparent, can be PEN, PET, polycarbonate or paper.

Next, multiple conductive traces 15 are selectively deposited on optically reflective layer 11 and on optically absorptive layer 12, as depicted in FIG. 1B. Solder paste 16a-16d is then applied to locations corresponding to the locations of optically absorptive layer 12, as shown in FIG. 1C. For example, solder paste 16a is located above optically absorptive layer 12a, solder paste 16b is located above optically absorptive layer 12b, solder paste 16c is located above optically absorptive layer 12c, and solder paste 16d is located above optically absorptive layer 12d.

Figure 1D:
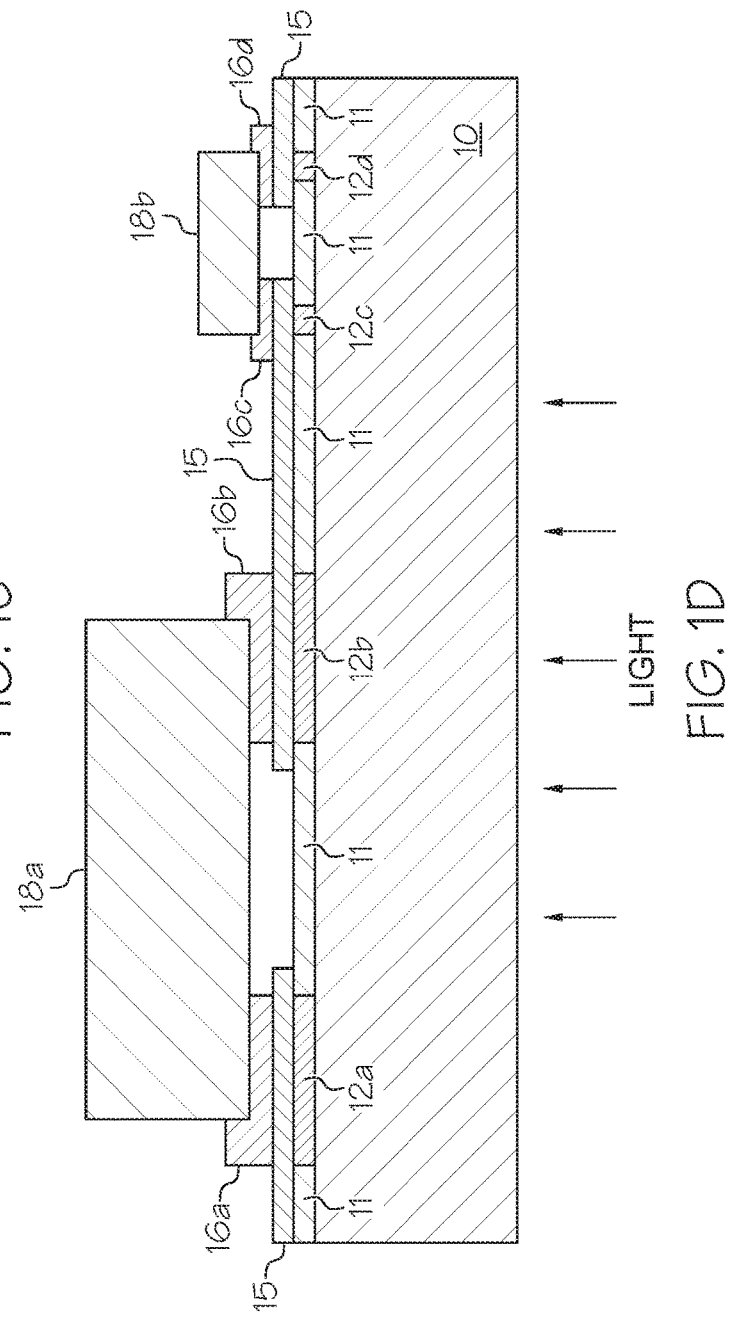

After a component 18a has been placed on solder paste 16a, 16b, and a component 18b has been placed on solder paste 16c, 16d, the entire structure is irradiated from the bottom (non-component side) of thermally fragile substrate 10 with uniform pulsed light, as depicted in FIG. 1D. Optically reflective layer 11 reflects the pulsed light, while optically absorptive layer 12 absorbs the pulsed light and becomes heated. This heat is subsequently transferred to solder paste 16a-16d and components 18a, 18b via thermal conduction to heat solder paste 16a-16d, thereby melting solder paste 16a-16d.

A precise amount of energy can be delivered to each of solder paste 16a-16d even though components 18a and 18b are of different sizes and require different amounts of energy. This is controlled by the various sizes of optically absorptive layer 12 under each of solder paste 16a-16d. Additionally, electrical traces 15, which would ordinarily be ablated or heated so much that their temperature would warp substrate 10, are protected by optically reflective layer 11.

Figure 2A:
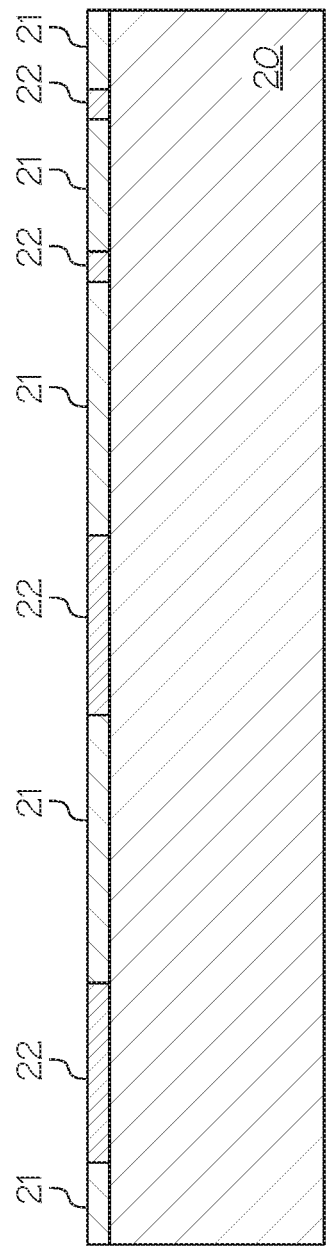
FIGS. 2A-2E depict a method for curing solder paste on a thermally fragile substrate using pulsed light, according to a second embodiment.

With reference now to FIGS. 2A-2E, there are illustrated a method for curing solder paste on a thermally fragile substrate using pulsed light, according to a second embodiment. Similarly to the first embodiment, an optically reflective layer 21 and an optically absorptive layer 22 are selectively printed on a thermally fragile substrate 20, as shown in FIG. 2A. The locations of optically absorptive layer 22 should correspond to the future locations of solder paste to be utilized to connect to a component. Thermally fragile substrate 20, which is preferably optically transparent, can be PEN, PET, polycarbonate or paper.

Figure 2B:
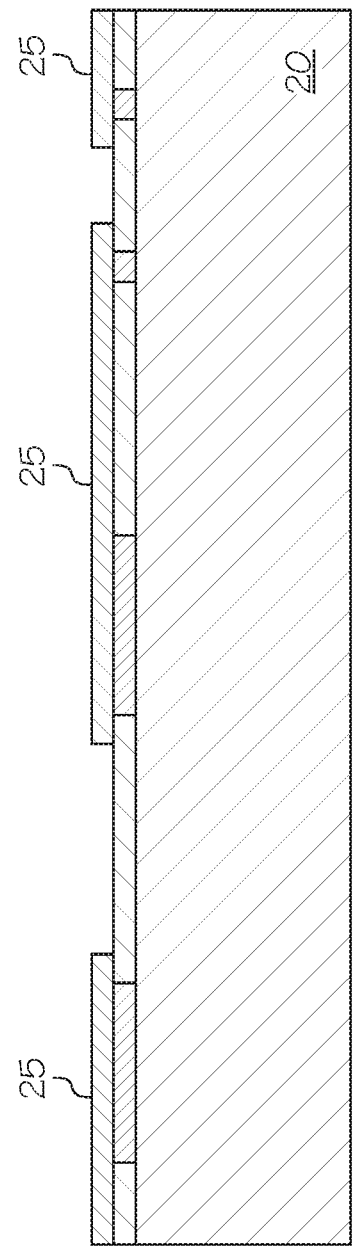
Figure 2C:
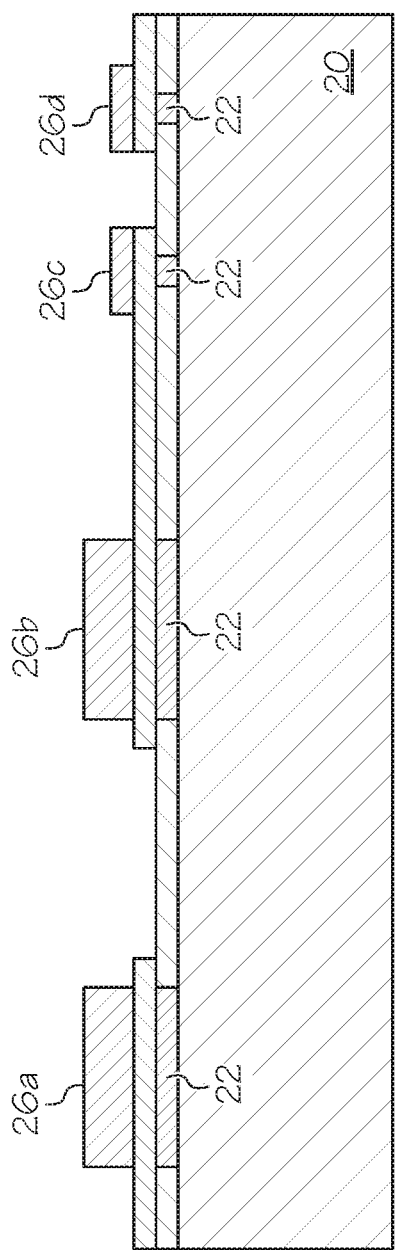
Figure 2D:
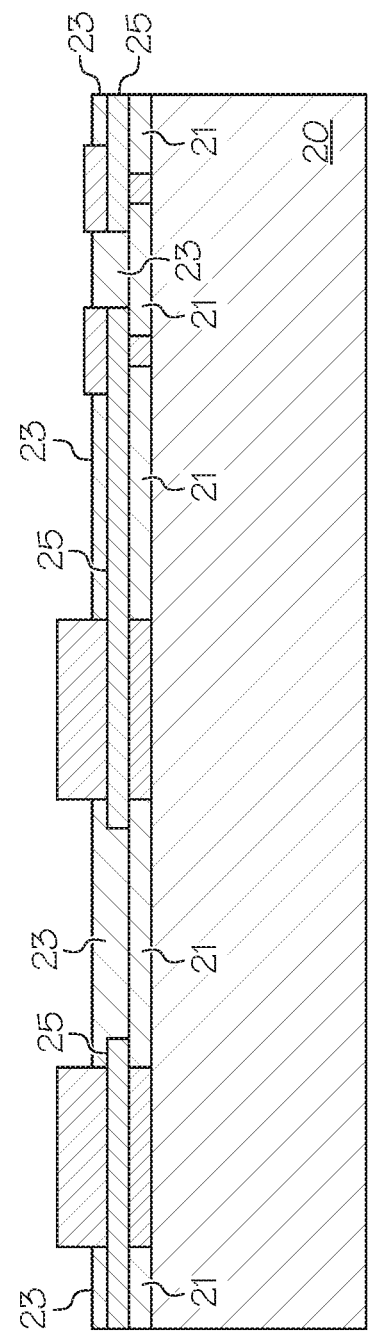

Next, multiple conductive traces 25 are selectively deposited on optically reflective layer 21 and on optically absorptive layer 22, as depicted in FIG. 2B. Solder paste 26a-26d is then applied to locations corresponding to the locations of optically absorptive layer 22, as shown in FIG. 2C. A second optically reflective layer 23 is then deposited on the exposed (not covered by solder paste) conductive traces 25 and the exposed (not covered by solder paste) optically reflective layer 21, as depicted in FIG. 2D.

Figure 2E:
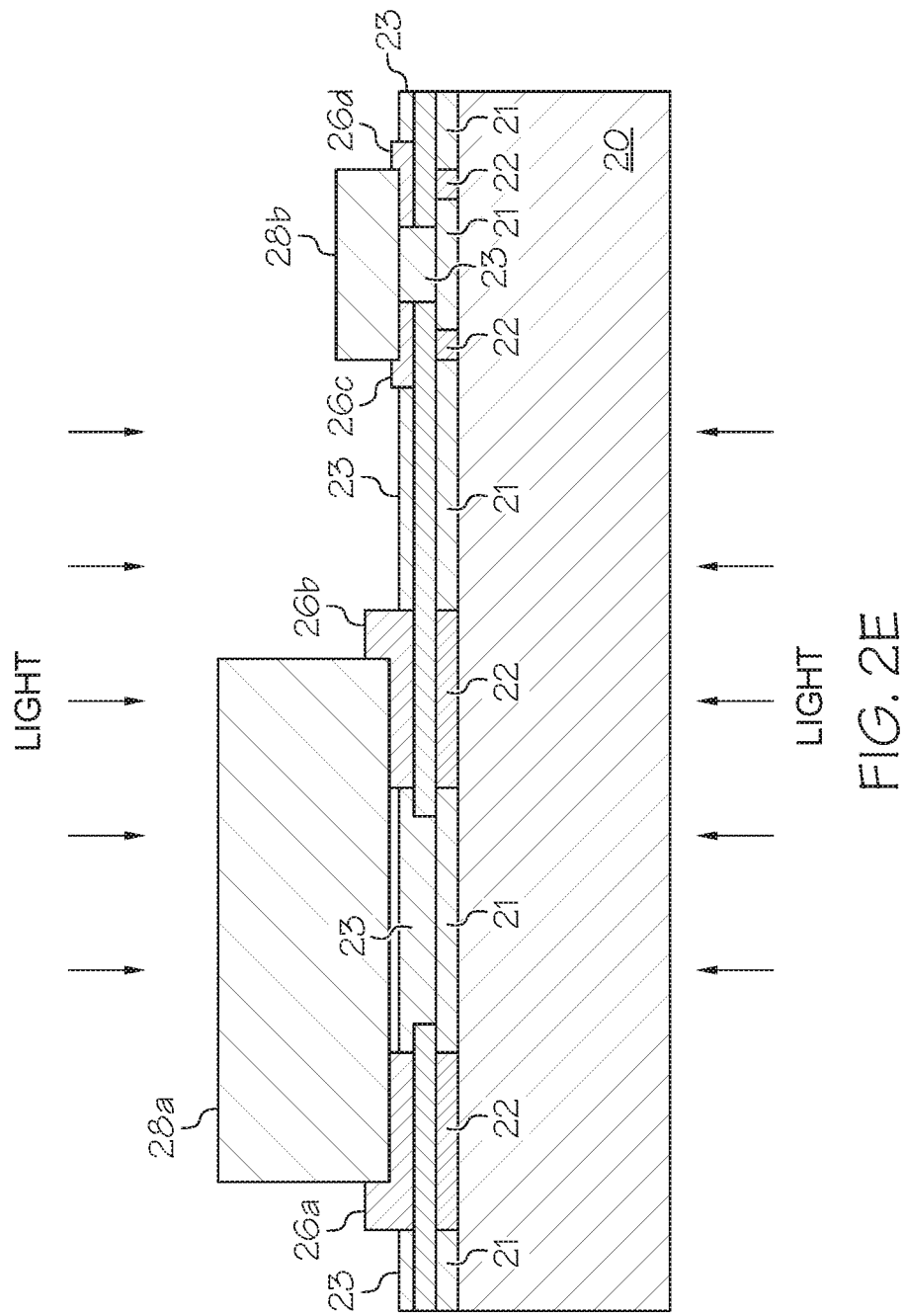

After a component 28a has been placed on solder paste 26a, 26b, and a component 28b has been placed on solder paste 26c, 26d, the entire structure is irradiated from the top and bottom with uniform pulsed light, as shown in FIG. 2E. Optically reflective layers 21 and 23 reflect the pulsed light, while optically absorptive layer 22 absorbs the pulsed light and becomes heated. This heat is subsequently transferred to solder paste 26a-26d and components 28a, 28b via thermal conduction to heat solder paste 26a-26d, thereby melting solder paste 26a-26d.

In the first embodiment shown in FIGS. 1A-1D, optically reflective layer 11 need not be selectively applied. It may simply be coated over substrate 10 and optically absorptive layer 12. When optically absorptive layer 12 is heated with pulsed light, the heat from optically absorptive layer 12 is transferred via conduction through optically reflective layer 11 to heat solder paste 15. This is possible on substrate 10 facing optically reflective layer 11 in the second embodiment shown in FIGS. 2A-2E as well. In the second embodiment, components 28A-28B serve as the absorbers on the top facing side of the stack to heat solder paste 26a-26d.

As has been described, the present invention provides an improved method for soldering electrical components onto a thermally fragile substrate by applying one or more printed masks to the thermally fragile substrate to allow selective absorption of pulsed light from a flashlamp, and thereby spatially tune the radiant exposure from the flashlamp to selectively heat the solder paste without causing damage to adjacent structures or the thermally fragile substrate. Components of different sizes and thicknesses can be attached to a thermally fragile substrate with the same pulsed light. The entire process can be performed in less than one second. In addition to curing solder paste, the method of the present invention can be utilized to thermally cure a variety of materials such as electrically conductive epoxies, adhesives, or other materials.

One advantage of the method of the present invention is that standard RoHS compatible solder can be used with a thermally fragile substrate. Another advantage of the method of the present invention is that no registration is required of the light curing source. Registration is provided by the printed masks.

While the invention has been particularly shown and described with reference to a preferred embodiment, it will be understood by those skilled in the art that various changes in form and detail may be made therein without departing from the spirit and scope of the invention.

What is claimed is:

1. A method for curing solder paste on a thermally fragile substrate, said method comprising:
   printing a first optically reflective layer and an optically absorptive layer on said thermally; and fragile substrate;
   selectively depositing a plurality of conductive traces on said optically reflective layer and on said optically absorptive layer;
   applying solder paste on selective locations corresponding to locations of said optically absorptive layer;
   selectively depositing a second optically reflective layer on said conductive traces and on said first optically absorptive layer;
   placing a component on said solder paste; and
   irradiating said thermally fragile substrate from two sides with uniform pulsed light, wherein said optically absorptive layer and said component absorb said pulsed light and becomes heated, and the heat is subsequently transferred to said solder paste via thermal conduction to melt said solder paste, wherein an energy of said pulsed light for processing said solder paste is between 3 and 30 J/cm$^2$.

2. The method of claim 1, wherein locations of said optically absorptive layer correspond to locations of said solder paste utilized to connect to said components.

3. The method of claim 1, wherein said thermally fragile substrate is optically transparent.

4. The method of claim 1, wherein said thermally fragile substrate is PEN.

5. The method of claim 1, wherein said thermally fragile substrate is PET.

6. The method of claim 1, wherein said thermally fragile substrate is polycarbonate.

7. The method of claim 1, wherein said thermally fragile substrate is paper.

8. The method of claim 1, wherein an area of said optically absorptive layer is directly proportional to a thermal mass of said component and the thermal mass of said solder paste.

* * * * *